(12) United States Patent
Vranish et al.

(10) Patent No.: US 6,410,999 B1
(45) Date of Patent: Jun. 25, 2002

(54) MAGNETOSTRICTIVE MAGNETICALLY CONTROLLED SPRAG LOCKING MOTOR

(75) Inventors: John M. Vranish, Crofton; Joseph P. Teter, Mount Airy, both of MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 65 days.

(21) Appl. No.: 09/710,813

(22) Filed: Nov. 9, 2000

Related U.S. Application Data (63) Continuation-in-part of application No. 09/348,866, filed on Jul. 7, 1999.

(51) Int. Cl.⁷ ................................................ H02N 2/00
(52) U.S. Cl. ...................... 310/26; 310/328; 318/118; 358/299
(58) Field of Search .................. 310/26, 328, 20.8, 310/12, 14

(56) References Cited

U.S. PATENT DOCUMENTS

| | | | | |
|---|---|---|---|---|
| 4,002,935 A | * | 1/1977 | Brauer | 310/27 |
| 5,025,183 A | * | 6/1991 | Fuschetto | 310/20 |
| 5,039,894 A | * | 8/1991 | Teter | 310/26 |
| 5,041,753 A | | 8/1991 | Clark et al. | |
| 5,079,460 A | | 1/1992 | Vranish | |
| 5,482,144 A | | 1/1996 | Vranish | |
| 5,530,312 A | * | 6/1996 | Teter | 310/328 |
| 5,602,434 A | * | 2/1997 | Risdl | 310/26 |
| 5,671,064 A | * | 9/1997 | Buechlerr | 358/299 |
| 5,705,863 A | * | 1/1998 | Teter | 310/26 |
| 5,731,881 A | * | 3/1998 | Buechler | 358/299 |

* cited by examiner

Primary Examiner—Joseph Waks
Assistant Examiner—J A Mohandesi
(74) Attorney, Agent, or Firm—Jacob Shuster (57) ABSTRACT

Actuator elements of a motor system are cyclically expanded magnetostrictively by energization of excitation coils to impart driving forces directly to a driven load through roller sprag means under preload bias in locking contact with a race formation in the driven load, to impart unidirectional movement to the driven load in one direction selected by generated Lorentz forces through magnetic field controlling means, as well as to provide power-off braking.

15 Claims, 5 Drawing Sheets

MAGNETOSTRICTIVE MAGNETICALLY CONTROLLED SPRAG LOCKING MOTOR

The disclosure presented herein which relates generally to electric drive motors involving cyclic magnetostrictive elongation of actuators to generate drive forces, constitutes a continuation-in-part of the disclosure in a prior copending application, Serial No. 09/348,866, filed Jul. 7, 1999.

BACKGROUND OF THE INVENTION

Electric motors for driving loads of the type for which the present invention is targeted, heretofore involved the use of extensive transmission gearing to augment the electrically generated drive forces. Such motor drive systems also had brake/clutch arrangements associated therewith for load safety purposes under power-off conditions. Hydraulic systems were also utilized for converting the electrical generated energy into heavy load lift forces, and involved extensive maintenance to avoid fluid leakage and associated hazards as well as to require additional fail safe brakes.

Although magnetostrictive motor systems involving use of roller locking arrangements are already known, they have not been adapted to or suitable for use in the drive of the aforementioned loads to which the present invention is targeted. Such magnetostrictive motor systems are disclosed for example in various patents involving the inventors of the present invention as inventor or co-inventors. Such patents consist of: U.S. Pat No. 5,039,894 issued Aug. 19, 1991; U.S. Pat. No. 5,041,753 issued Aug. 20, 1991; U.S. Pat. No. 5,079,460 issued Jan. 7, 1992, U.S. Pat. No. 5,482,144 issued Jan. 9, 1996; U.S. Pat. No. 5,530,312 issued Jun. 25, 1996; and U.S. Pat. No. 5,705,863 issued Jan. 6, 1998.

It is an important object of the present invention to provide magnetostrictive motor systems generating sufficiently high drive forces for transfer to certain targeted loads in an efficient and reliable manner, involving relatively simple and less costly arrangements for imparting either linear or rotary motion to the driven load.

SUMMARY OF THE INVENTION

In accordance with the present invention, an electric motor unit for either linear or rotary motion applications, is provided with a magnetostrictive locking arrangement through which cyclically generated driving force is transferred to a load under directional switching control of a Lorentz force type of magnetic field unlocking system. The magnetostrictive locking arrangement involves sprag locking by multi-dimensional rollers that are spring loaded to provide motor lock up during electric power-off conditions so as to act as a brake. Such rollers undergo controlled engagement for transfer of high drive forces cyclically generated by magnetostrictive expansion of actuators, to reliably impart either linear or rotary motion directly to a load in a selected direction through a relatively simple force transfer arrangement which accommodates direction switching under load.

BRIEF DESCRIPTION OF DRAWING

A more complete appreciation of the invention and many of its attendant advantages will be readily appreciated as the same becomes better understood by reference to the following detailed description when considered in connection with the accompanying drawing wherein.

DETAILED DESCRIPTION OF PREFERRED EMBODIMENT

Figures 1, 18:
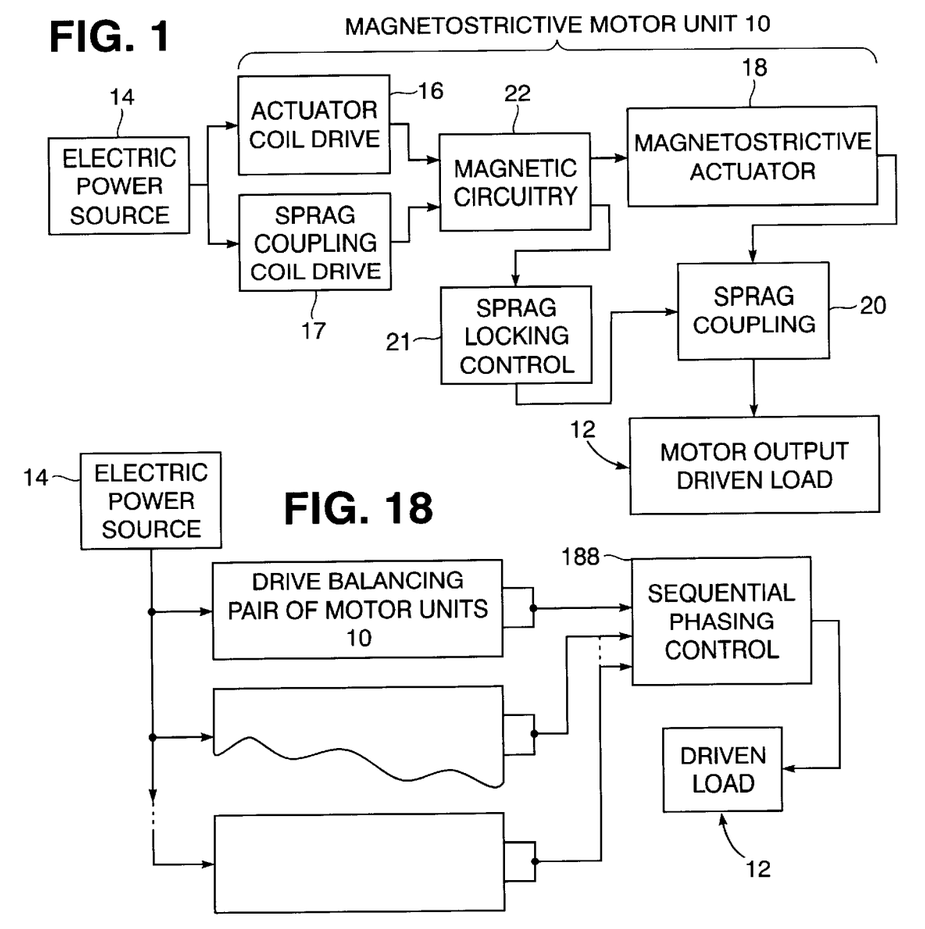
FIG. 1 is a simplified block diagram of a magnetostrictive motor unit in accordance with the present invention covering various embodiments of the present invention.
FIG. 18 is a block diagram of a motor drive system embodying multiple magnetostrictive, motor units.

Referring now to the drawing in detail, FIG. 1 diagrams a magnetostrictive motor unit, generally referred to by reference numeral 10, through which movement is imparted to a driven load 12 in response to cyclic input of electrical energy from an electric power source 14 connected to an electric coil drive actuator 16 and a coil drive sprag coupling 17. Such coil drive actuator and sprag coupling 16 and 17 are associated through magnetic circuitry 22 with a magnetostrictive actuator 18, operatively coupled with the load 12 through a 3-dimensional sprag coupling 20. Electrical energy is converted into mechanical drive of the load 12 under control of the magnetic circuitry 22 through a sprag locking control 21 as diagrammed in FIG. 1.

Figure 2:
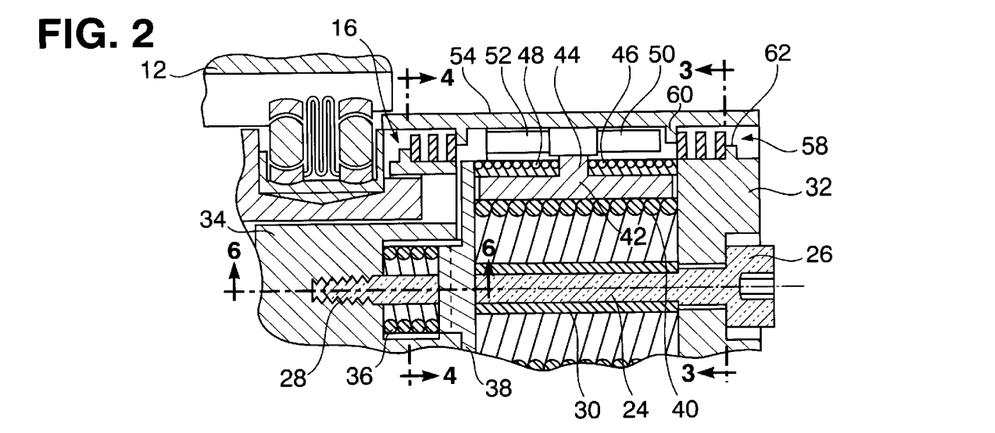
FIG. 2 is a partial side section view of a linear drive type of magnetostrictive motor unit, in accordance with one embodiment of the present invention.
Figure 5:
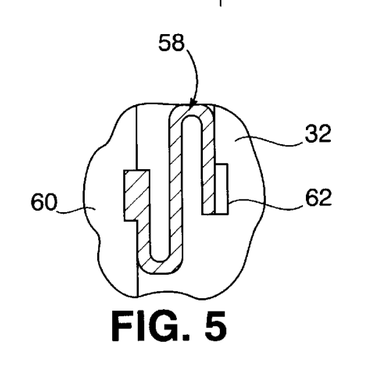
Figure 6:
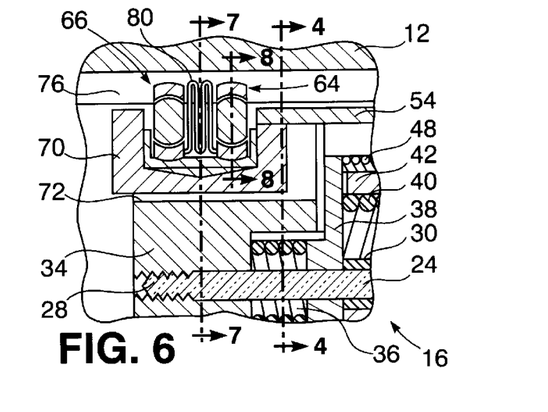

FIGS. 2–8 illustrate one embodiment of the linear motion imparting magnetostrictive motor unit 10 diagrammed in FIG. 1, involving a single element type of the actuator 16 in the form of a magnetostrictive actuator tube 30 as shown in FIGS. 2 and 6 supported on a non-ferrous bolt 24 having a radially enlarged head 26 at one axial end and a threaded screw portion 28 at the other axial end. The bolt 24 supports the magnetostrictive actuator tube 30 held assembled thereon in axially spaced relation to the bolt head 26 by axial abutment with an end piece 32. The screw portion 28 at the other axial end of the bolt 24 is threadedly connected to an end piece 34, within which a preloaded return spring 36 is enclosed, positioned about the bolt and held in axial abutment with a soft ferromagnetic washer 38 engaged with one axial end of the magnetostrictive tube 30.

With continued reference to FIG. 2, the electric drive actuator 16 is formed by a magnetostrictive excitation coil 40 positioned about the tube 30 within a soft ferromagnetic cylindrical retainer 42 axially positioned between the end piece 32 and the washer 38. The cylindrical retainer 42 has a formation 44 extending radially therefrom midway between its opposite axial ends to separate a pair of axially spaced Lorentz force generating coils 46 and 48 positioned thereon. Such coils 46 and 48 underlie permanent magnets 50 and 52 disposed in underlying relation to a cylindrical control slide 54 subject to displacement by the Lorentz forces. Such slide 54 as shown in FIGS. 2 and 6, projects axially beyond the excitation drive coil 40 in overlying relation to the end pieces 32 and 34 for engagement with the flexure springs 58 of the sprag locking control 21 as hereinafter described.

Figure 3:
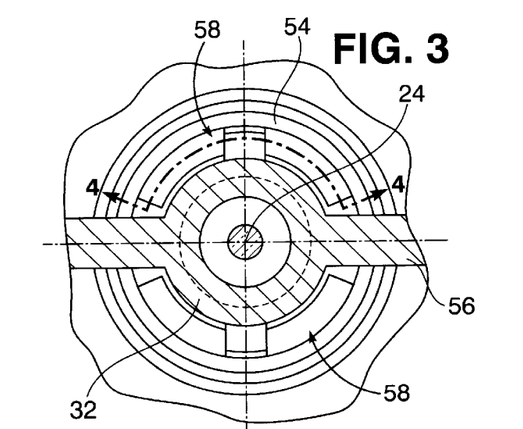
FIGS. 3, 4, 5 and 6 are partial section views respectively taken substantially through planes indicated by section lines 3—3, 4—4, 5—5 and 6—6 in FIG. 2.
Figure 4:
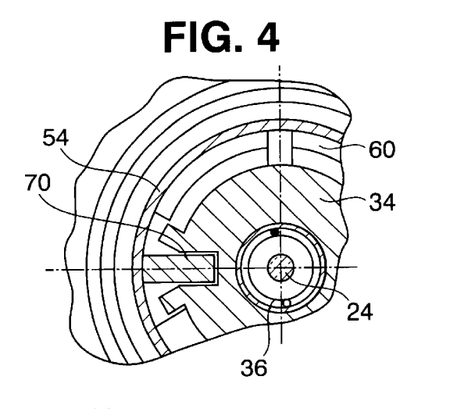

As shown in FIGS. 2, 3 and 5, the end piece 32 has a pair of mechanical grounding extensions 56 projecting radially therefrom in 180° relation to each other, separating a pair of flexure springs 58 positioned on the end pieces 32 and 34. Each flexure spring 58 as shown in FIGS. 2 and 5 is made of elongated flexible material having a tab 60 at one end attached to the slide 54 at one axial end thereof, with the other spring end in abutment with an attachment on the end piece such as the tube 62 on the end piece 32.

Figure 7:
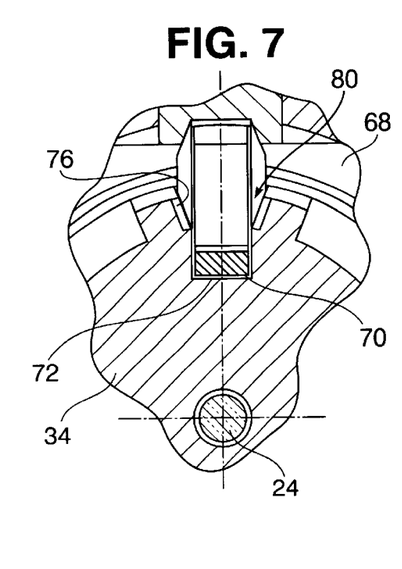
FIGS. 7 and 8 are partial section views respectively taken substantially through planes indicated by section lines 7—7 and 8—8 in FIG. 6.
Figure 8:
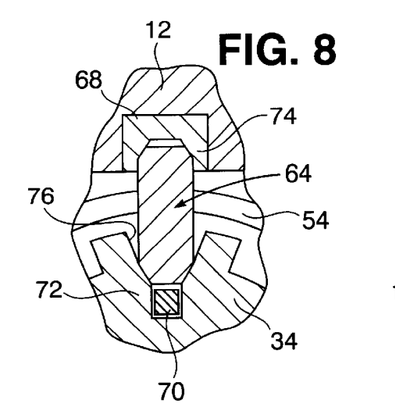

As shown in FIGS. 4, 6, 7 and 8, the sprag coupling 20 is formed by 180° angularly spaced pairs of 3-dimensional locking sprag rollers 64 and 66 extending radially from the end piece 34 into sprag races 68 formed in the driven load 12, such as a door panel. The sprag rollers 64 and 66 of each pair are interconnected by flexure springs 80 as shown in FIG. 6 and are positioned within a sprag tripper 70 retained within an annular groove 72 formed in the end piece 34. The construction and arrangement of each sprag device 64 and 66 is generally known, as disclosed in U.S. Pat. No. 5,482,144 to Vranish aforementioned. Thus, the sprag rollers 64 as shown in FIGS. 7 and 8 includes a driven reaction member 74 positioned within a positioning slot 68 of the driven load 12 in radially spaced relation to a driver formation 76 projecting radially from the end piece 34. Points of contact are accordingly established between the sprag rollers 64 or 66 and both the reaction member 74 and the space race formation 76. Furthermore, the sprag rollers 64 or 66 are selectively engaged and released by the slide 54 in response to axial displacement thereof from the positions shown in FIG. 6 against the bias of flexure springs 80 as shown in FIGS. 6 and 7, to facilitate selective engaging and release.

As shown in FIG. 8, the slide 54 can be positioned so that only sprag rollers 64 are engaged. Under such circumstance, the oscillatory motion of the magnetostrictive motor unit 10 drives the load 12 continuously from right to left. The slide 54 can also be positioned such that only sprag rollers 66 are engaged. Under the latter circumstance, the oscillatory motion drives the load 12 continuously from left to right. Slide 54 can also be positioned such that both sets of sprag rollers 64 and 66 are simultaneously engaged, in which case the load 12 is locked in place.

The foregoing arrangement of the motor unit 10 shown in FIGS. 2–8 includes the magnetic circuitry 22 diagrammed in FIG. 1, that is established in coaxial relation to the motor support bolt 24. Such magnetic circuitry is interconnected with the radially inner drive excitation coil 40 of the actuator 16 which powers the magnetostrictive tube 30 and the radially outer Lorentz force generating control coils 46 and 48 to provide for a sprag switching control action under load by axial displacement of the slide 54. The magnetic circuitry 22 is completed by the permanent magnets 50 and 52 which are each attached to slide 54 between the coils 46 and 48 and the slide 54.

When the radially outer coils 46 and 48 as shown in FIG. 2 are selectively activated, the slide 54 is axially displaced in a selected direction into or out of engagement with the sprag devices 64 and 66 of each pair. The sprag rollers 66 when engaged by the slide 54 are unlocked and held open while the other sprag rollers 64 of each pair remain engaged to set the direction of linear motion imparted to the load 12. The magnetostrictive drive excitation coil 40 is cyclically energized to impart such linear motion incrementally to the load 12 by ratcheting in the preset direction through roller locking engagement of the sprag rollers 64 in the races 68 of the load 12 in response to magnetostrictive expansion of the tube 30. When the drive coil 40 is abruptly deenergized, the return spring 36 rapidly exerts its compression on the tube 30 through washer 38, causing the tube 30 together with end piece 34 to undergo a return stroke by contraction to its original position. During such return stroke, the movement of end piece 34 with respect to sprag rollers 64 causes them to roller unlock and thus the load 12 is not effected by the return stroke. The position of the slide 54, held constant throughout, permits the flexure springs 80 to reengage the sprag rollers 64 for drive upon expansion tube 30. This process repeats itself, converging the oscillatory motion of the tube 30 into single direction load motion with sprag rollers 64 acting like mechanical diodes. When the slide 54 engages and unlocks sprag rollers 64, sprag rollers 66 drive load 12 in the opposite direction. Thus, the sprag rollers lock and drive the load on in response to magnetostrictive contraction and roller unlock and reset in response to expansion. When the slide 54 is not displaced under energization of the motor unit, the flexure springs 80 cause both sets of sprag rollers 64 and 66 to lock the load 12 in both directions for safety purposes.

The bolt 24 made of non-ferrous material acts on the ferromagnetic end piece 32 and washer 38 to preload the magnetostrictive actuator 18 with the coils 40, 46 and 48 wrapped around the tube 30 and the retainer 42 are made of soft ferromagnetic material so as to act as part of the magnetic circuit accommodating drive of the slide 54 through which the sprag rollers 64 and 66 are selectively released and engaged as hereinbefore described.

The two sprag trippers 70 at one axial end of the slide 54 and the attachment thereto of the flexure springs 80 assists the slide 54 in its flux return action during operation of the magnetic circuit for opening and closing action of the sprag rollers 64 and 66. Thus, axial displacement of the slide 54 is effective through the trippers 70, passing under each pair of sprag rollers 64 and 66, to contact and open one or the other thereof.

The flexure springs 58 and 60 attached to the slide 54 at opposite axial ends thereof are selectively made thin in the direction of slide displacement, but wider in the radial direction to prevent contact sticking of the permanent magnets 50 and 52 to the retainer 42 and coils 48, 50, to thereby maintain the slide 54 appropriately constrained during operation of the linear magnetostrictive motor unit as depicted in FIGS. 2–8.

Figure 9:
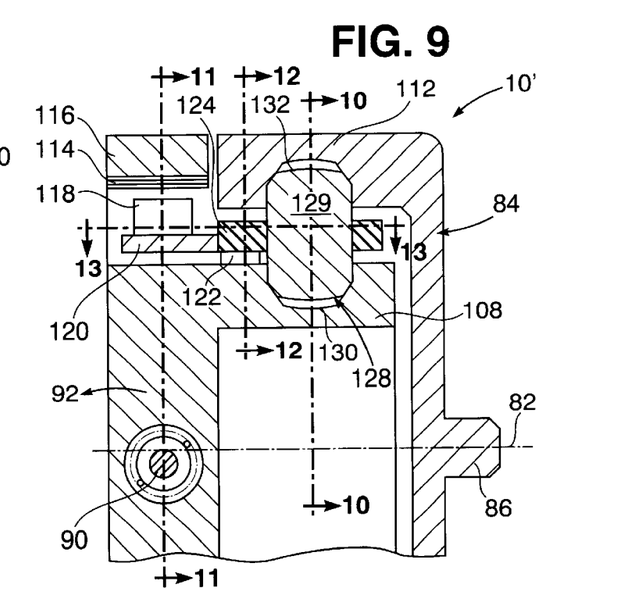
FIG. 9 is a partial side section view of a rotary drive type of magnetostrictive motor unit in accordance with a second embodiment of the present invention.
Figure 10:
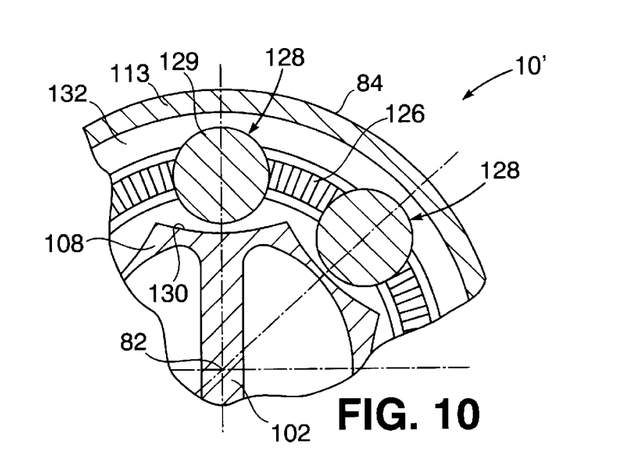
FIGS. 10, 11, 12 and 13 are partial section views respectively taken substantially through planes indicated by section lines 10—10, 11—11, 12—12 and 13—13 in FIG. 9.
Figure 11:
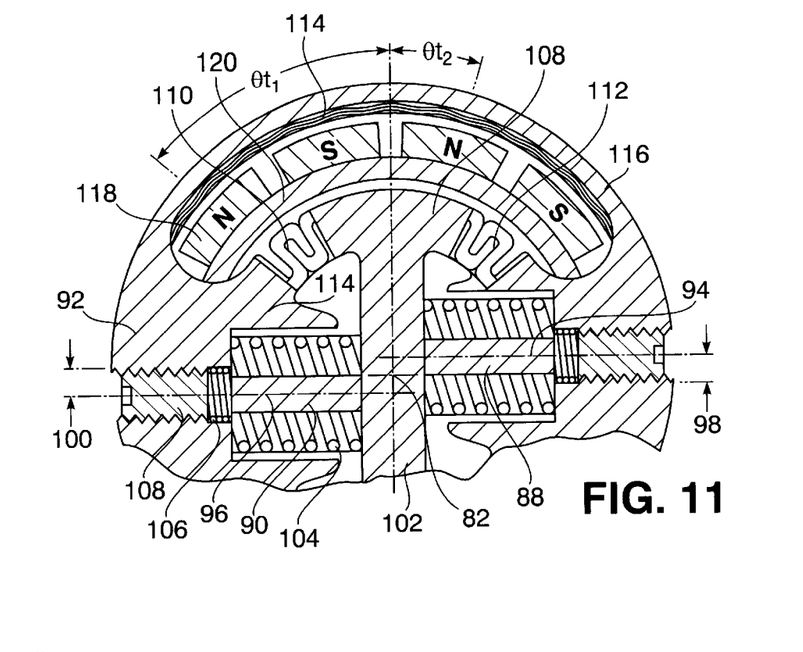
Figure 12:
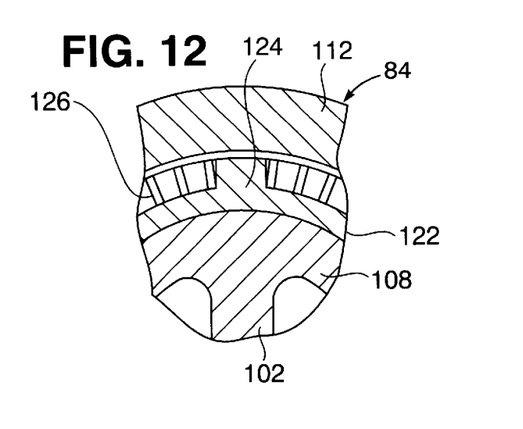
Figure 13:
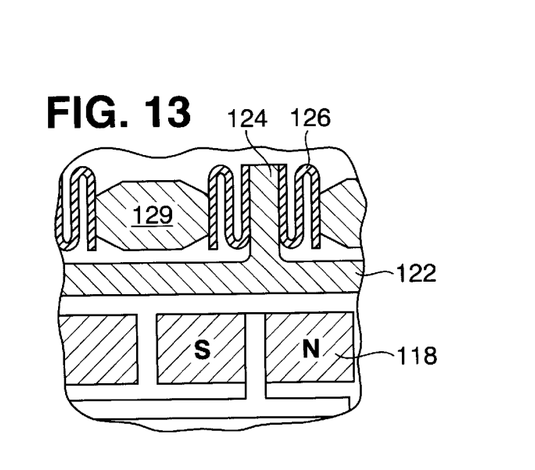

In accordance with another embodiment of the invention, FIGS. 9–13 depict another rotary motor unit 10' through which continuous rotary motion in a clockwise or counter-clockwise direction about an axis 82 is imparted to a driven rotor 84 having a shaft section 86 extending axially therefrom as shown in FIG. 9, to which some load is connected. Such rotary motor unit 10 ' as shown in FIG. 11 includes a pair of magnetostrictive actuator rods 88 and 90 slideably mounted within a motor grounding support 92 for axial displacement along axes 94 and 96 at right angles to the rotary drive axis 82. The actuator rod axes 94 and 96 are respectively offset from the drive axis 82 by equal distances 98 and 100 in opposite directions as depicted in FIG. 11, so as to establish moment arms of drive forces exerted by opposing linear expansion and contraction of the rods 88 and 90 along their axes 94 and 96, onto an oscillator member 102 a perpendicular to the drive axis 82. As also shown in FIG. 11, each of the rods 88 and 90 is surrounded by an excitation drive coil 104 through which the drive forces are selectively generated in response to electrical current supplied to such drive coils. The rods 88 and 90 are adjustably preloaded by axial pressure exerted thereon by springs 106 engaged therewith at the radially outer ends thereof in spaced relation to the radially inner ends of adjustment screws 108 threadedly received within the motor grounding 92 in axial alignment with the offset axes 94 and 96 of the rods. The forces generated by electrical energization of the drive coils 104 will accordingly apply angular oscillatory motion to the oscillator member 102 about the drive axis 82. A pair of angular sectors 109 are attached to the oscillator member 102 at the radially outer ends thereof. Flexure springs 110 are engaged with the sectors 109 for exerting opposing bias on the oscillator member 102 yieldably held in a neutral position as shown in FIG. 11. A plurality (such as 8) of three-dimensional sprag rollers 128 as shown in FIG. 10 are radially positioned between the angular sector 109 of the oscillatory member 102 and a radially outer rim portion 112 of the rotary driven member 84 in order to convert the oscillatory angular motion of the sectors 108 into a continuous rotary motion of the driven member 84 by means of the ratcheting action of the sprag rollers 128 under control of sprag switching by magnetic circuitry involving actuation through Lorentz Meander lines 114 underlying radially outer angular rim portions 116 of the motor grounding support 92. The magnetic circuit as shown in FIG. 11 also includes arcuate-shaped permanent magnets 118 of opposite radial polarity radially positioned between the Meander lines 114 and radially underlying cylindrical magnetic flux conductors 120 as shown in FIGS. 9 and 13.

Each of the sprag rollers 128 as shown in FIGS. 9, 10 and 13 is closely spaced from the bottom of recesses 130 formed in the drive sector 108 from which side surfaces of the recesses 130 establish contact with the sprag rollers 128. Contact is also established between the sprag rollers 128 and the sides of a recess 132 formed in the radially outer sprag reaction rim portion 112 of the rotary driven member 84.

When the Meander lines 114 are activated, by electric current supplied thereto, each of the sprag rollers 128 is angularly biased in one direction through sprag springs 126 on opposite angular sides thereof as shown in FIG. 13 to establish contact of such rollers 128 with selected side faces in the recesses 130, 132 respectively formed in the drive sectors 109 of the oscillator 102 and the reaction rim portion 112 of the rotary driven member 84. One-way rotational ratcheting action of the sprag rollers 128 is thereby established in a selected direction. The magnetostrictive drive coils 104 are then intermittently energized for cyclic rotational advancement of the driven member 84 in a preselected direction by expansion of one of the magnetostrictive drive rods 88 and 90, made effectively possible by the ratcheting action of the sprag rollers 128 as hereinbefore pointed out with respect to the sprag devices 64 and 66 associated with the linear motion type motor unit 10 depicted in FIGS. 2–8.

Referring once again to FIGS. 9 and 11, the series of permanent magnets 118 of alternate polarity are angularly displaced under the influence of electric current supplied to the multi-layered Meander wires 114 by attachment thereof to the mechanical grounding 92. Such angular displacement is effected in opposite directions under directional control of the electrical current supplied to enhance generation of Lorentz forces by virtue of the magnetic circuit involved, which in turn positions the sprag rollers 128 against one of the faces in recess 130 to determine the rotational direction of the driven member 84 and about the axis 82 to enable use of small levels of drive current in the excitation drive coils 104 for expansion and contraction of the two magnetostrictive actuator rods 88 and 90 in such a manner as to accommodate conversion of the linear motion to angular oscillation of the oscillator 102 so as to drive the sprag rollers 128 through the sectors 108. Such angular oscillatory motion in turn, is converted to continuous unidirectional rotary motion of driven member 84 about the axis 82. The sprag rollers 128 are adjustably preloaded through the flexure springs 126 connected to axial projections 124 on the cylinder 122 as shown in FIGS. 12 and 13 to either provide a fail-safe brake action when power is off or establish a motor free-wheel condition. Rotary drive of driven member 84 is accordingly achieved in a counterclockwise direction by expansion of the rods 88 and 90 and in a clockwise direction during rod contraction under return bias of springs 106. The Lorentz forces generated through wires 114 is sufficient to only position the sprag rollers 128 so as to set the rotational drive direction.

Figure 14:
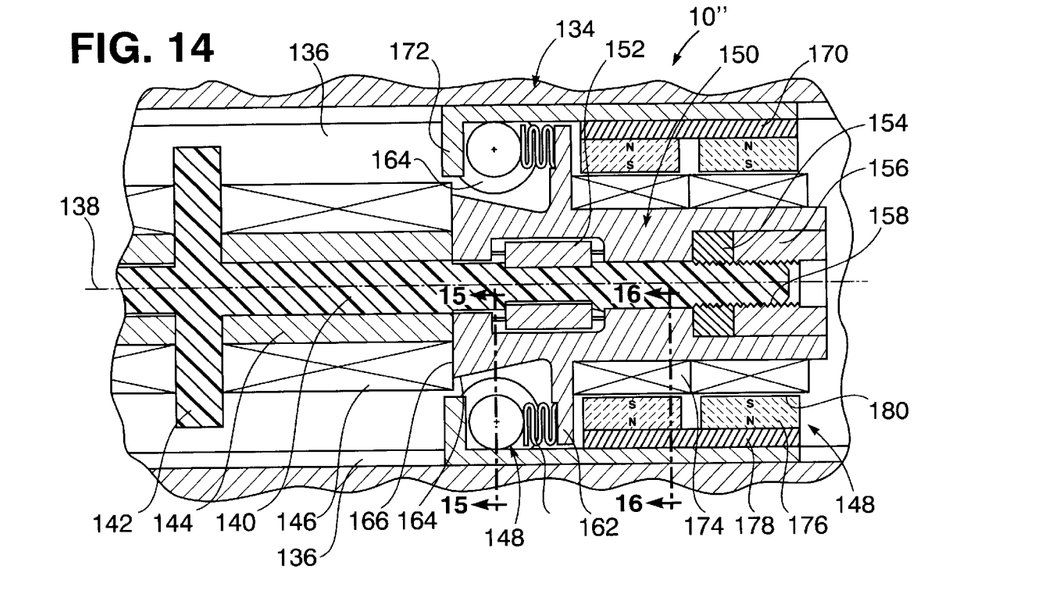
FIG. 14 is a partial side-section view of a dual actuator type of magnetostrictive linear drive motor unit, in accordance with a third embodiment of the present invention.
Figure 15:
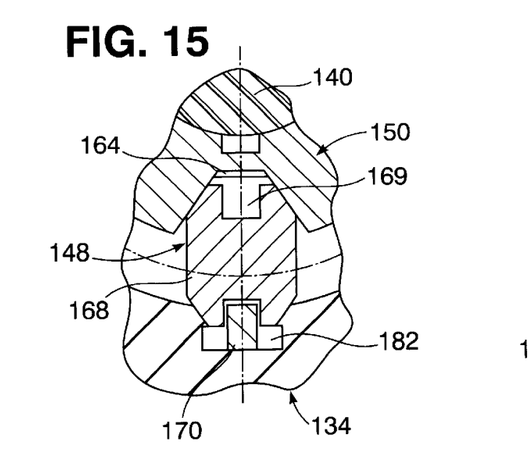
FIGS. 15 and 16 are partial section views respectively taken substantially through planes indicated by section lines 15—15 and 16—16 in FIG. 14.
Figure 16:
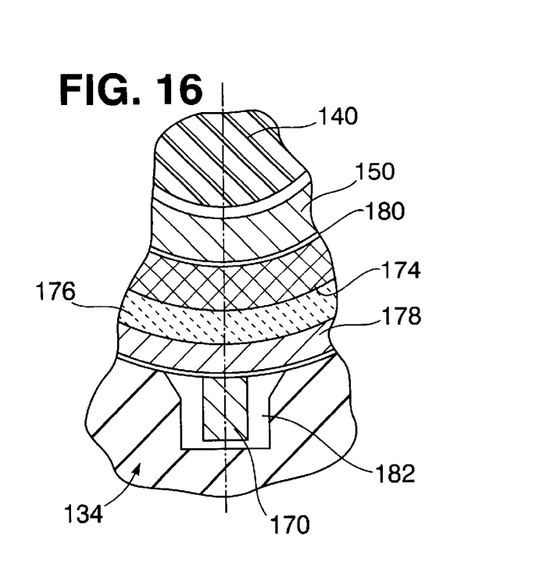

Pursuant to yet another embodiment, FIGS. 14, 15 and 16 illustrate a magnetostrictive linear drive type of motor unit 10" for imparting movement to the load, such as a door 134 having a groove 136 formed therein. This embodiment is designed to operate under mechanical resonance conditions of its operating parts. The motor unit 10" is positioned within such groove motor drive axis 138. Such drive axis 138 is the axis of a central elongated support bolt 140 136 for linear displacement of the load 134 in opposite directions under selective control along a made of non-ferromagnetic material. The bolt 140 has a mechanical grounding extension 142 projecting radially therefrom between opposite axial ends thereof to axially separate a pair of coaxial magnetostrictive actuators supported thereon, respectively formed by a cylinder 144 made of magnetostrictive material and an electrical excitation drive coil 146 as shown in FIG. 14. Energization of the drive coils 146 causes axial expansion of the cylinders 144 to impart linear displacement to the door 134 in opposite directions along the bolt axis 138 through two 3-dimensional roller-sprag locking systems 148 respectively mounted on the axial end portions of the bolt 140 in axial abutment with the cylinders 144 of the magnetostrictive actuator assemblies.

The roller-sprag locking systems 148 are associated with an axially elongated cylindrical cap 150 surrounding the bolt 140 and having a spline 152 preventing its rotational displacement relative to the bolt while accommodating limited axial displacement by abutment with one of the actuator cylinders 144 at one axial end in response to magnetostrictive expansion of the cylinder 144 as aforementioned. A cylindrical cavity is formed in the cap 150 at its other axial end to receive a washer 154 under an adjustable axial pressure of a nut 156 threadedly mounted on a threaded axial end portion 158 of the bolt 140. The adjusted axial pressure so exerted in one axial direction on the cap 150 through washer 154 preloads the magnetostrictive cylinder 144 against mechanical ground 142. A mirror image of the foregoing arrangement of cap 150 and washer 154 is provided on the other axial side of the mechanical ground 142. A pair of 3-D rollers 168 of the sprag locking system 148 are respectively positioned between ramp formations 164 and a radially outer cylindrical slide 170 having an annular flange 172 at its inner axial end in engagement with the rollers 168 on their axial sides opposite preload springs 160 seated with an annular support 162 formed on the cap 150. The ramp formation 164 extends between the support 162 and the inner axial end 166 of the cap 150. Each roller 168 has an annular groove 169 formed therein into which the slide 170 and its flange 172 project so as to capture and position therein the preload spring 160. Thus, the preload springs 160 on opposite axial sides of the mechanical ground 142 serve only to position the 3-D rollers 168.

Also mounted on the cap 150, axially spaced by the support 162 from each pair of 3-D rollers 168, are a pair of Lorentz force generating coils 174 underlying a pair of permanent magnets 176 of opposite polarity enclosed within a cylindrical retainer 178 with some radial clearance 180 from each slide 170 as shown in FIG. 16. Each slide 170 is received within a groove 182 formed in the load 134 as shown in FIGS. 15 and 16 into which the rollers 168 project.

With continued reference to FIGS. 14, 15 and 16, only one of the two axially aligned magnetostrictive actuator assemblies is activated at a time by electrical energization of its drive coil 146 to effect expansion of its magnetostrictive cylinder 144 and axial displacement of its cap 150 in axial abutment therewith. Such displacement of the cap 150 with its ramp formation 164 is transferred to the load 134 by the rollers 168 held by the preload springs 160 in contact with the load 134 and cap grooves 182 as shown in FIG. 15. When the expanded magnetostrictive cylinder 144 contracts, the ramp formations 164 are axially displaced under axial pressure exerted on the cap 150 to release the rollers 168 from locking contact as they roll down toward the smaller diameter end of the ramp formation 164. Once the rollers 168 are so released following transfer of linear motion to the load 134, locking contact is restored by the preload springs 160 for prompt restart of another drive cycle upon energizing of the Lorentz force drive coils 174, oppositely wound on the opposite axial end portions of the bolt 140.

When one selected pair of coils 174 are activated under switching control, a Lorentz force is generated on the associated pair of permanent magnets 176 of opposite radial polarity to either release or further preload the pair of 3-D rollers 168 associated therewith. Upon unlocking of the selected pair of 3-D rollers 168 on one axial side of the mechanical ground formation 142, the other pair of rollers 168 is subjected to periodic pulsing of its associated magnetostrictive cylinder 144 to continuously impart intermittent linear movement to the load 134 in the direction corresponding to that selected through the switching control. When both pairs of 3-D rollers 168 are engaged under pressure of the preload springs 160, the load 134 is accordingly held in a stationary, fail safe condition for power-off braking purposes.

Figure 17:
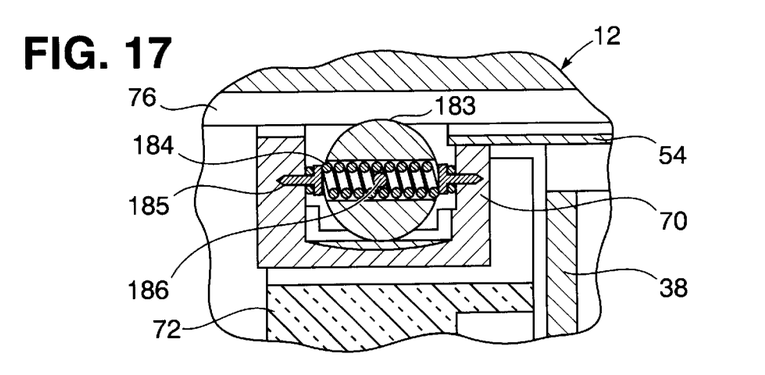
FIG. 17 is a partial section view illustrating a modification of the sprag coupling shown in FIG. 6, as a fourth embodiment of the present invention.

A still further embodiment is shown in FIG. 17, as a modification of the sprag coupling shown in FIG. 6 wherein the dual sprag rollers 64 and 66 are involved. Such sprag rollers are replaced by a single three dimensional sprag roller 183 having a coil spring 184 anchored at opposite ends to the tripper 70, heretofore described in connection with FIG. 6. The sprag spring 184 engages the sprag roller 183 through a pin 186 to form an alternative arrangement for engagement with the tripper 70 so as to effect an overall change in direction of the force applied to the load 12.

In accordance with the present invention, plural pairs of motor units as hereinbefore described, such as the motor units 10, may be powered from source 14 to sequentially drive a common load 12 under control of a sequential phasing control system 188 as diagrammed in FIG. 18. Multiple motor units 10 when so controlled in pairs ensures balancing of drive forces during each 360° operational cycle. Such drive forces are respectively transmitted from the motor units 10 to the load 12 in out-of-phase relation to each other by $$180° \div \frac{(N)}{2},$$

where N is the number of units 10 involved. Such use of multiple motor units 10 transmitting drive force in sequence during each operational cycle provides for greater start-up force or torque and smoother cyclic operation of the load 12 being driven.

Obviously, other modifications and variations of the present invention may be possible in light of the foregoing teachings. It is therefore to be understood that within the scope of the appended claims the invention may be practiced otherwise than as specifically described.

What is claimed is:

1. In a motor system having actuator means adapted to undergo a magnetostrictive expansion in response to energization of an excitation drive coil and a driven load undergoing unidirectional movement, the improvement residing in: support means for guiding cyclic displacement of the actuator means during said expansion thereof; magnetic field control means for selection of direction with respect to said unidirectional movement imparted to the driven load; and sprag locking means operatively mounted on the support means and enabled by the magnetic field control means for direct transfer to the driven load of a driving force generated by said cyclic displacement of the actuator means to impart said unidirectional movement to the driven load.

2. The motor system as defined in claim 1 wherein said actuator means comprises a single magnetostrictive tube positioned on the support means.

3. The motor system as defined in claim 2 wherein said sprag locking means includes: a pair of rollers, roller engaging race means respectively mounted in a radially spaced relation within the driven load and on the support means for receiving therein said pair of rollers and spring means respectively biasing both of the rollers into a locking contact with the race means for exerting a braking force on the driven load while the rollers are disengaged by the magnetic field control means.

4. The motor system as defined in claim 1 wherein sprag locking means includes: a pair of rollers, roller engaging race means respectively mounted in radially spaced relation within the driven load and on the support means for receiving therein said pair of rollers and spring means respectively biasing both of the rollers into locking contact with the race means for exerting a braking force on the driven load while the rollers are disengaged by the magnetic field control means.

5. The motor system as defined in claim 1 wherein said sprag locking means includes: a plurality rollers, roller engaging races respectively connected to the driven load and the actuator means; and spring means biasing said rollers into locking contact within the races for exerting a braking force on the driven load while the actuator means is maintained deactivated under magnetic bias of the magnetic field control means.

6. The motor system as defined in claim 5 wherein said actuator means includes: a pair of magnetostrictive rods, an oscillator on which one of the races is mounted, said rods being radially spaced from each other relative to a rotational axis of the driven load to render said movement of the driven load rotational.

7. The motor system as defined in claim 1 wherein said actuator means comprises a pair of magnetostrictive tubes mounted on the support means in spaced, axially aligned positions to render said movement of the driven load linear.

8. The motor system as defined in claim 7 wherein said sprag locking means includes: at least two axially spaced rollers; radially spaced races respectively mounted by the driven load and the support means to receive said rollers therein; and spring means biasing said rollers into locking contact with both of the races for holding the driven load in a fail-safe braked condition.

9. The motor system as defined in claim 8 including: ramp means mounted on the support means for displacing one of the axially spaced rollers out of locking contact with one of the races in response to said expansion of the actuator means to accommodate said direct transfer of the driving force to the driven load by the rollers.

10. The motor system as defined in claim 1, wherein said sprag locking means includes: at least two axially spaced rollers; radially spaced races respectively mounted by the driven load and the support means to receive said rollers therein; and spring means biasing said rollers into locking contact with both of the races for holding the driven load in a fail-safe braked condition.

11. The motor system as defined in claim 10 including: ramp means mounted on the support means for displacing one of the axially spaced rollers out of locking contact with one of the races in response to said expansion of the actuator means to accommodate said direct transfer of the driving force to the driven load by the rollers.

12. The motor system as defined in claim 11 including locking control means for switching selection of said one of the two axially spaced rollers displaced out of locking contact under load to directionally reverse said unidirectional movement imparted to the driven load.

13. The motor system as defined in claim 10 including locking control means for switching selection of said one of the two axially spaced rollers displaced out of locking contact under load to directionally reverse said unidirectional movement imparted to the driven load.

14. The motor system as defined in claim 1, wherein said sprag locking means comprises: a single sprag roller; and spring means biasing said sprag roller into locking contact with the driven load for holding thereof in a fail-safe braked condition.

15. In a motor system for cyclic operation of a driven load by a plurality of magnetostrictive drive units under sequential phase control, each of said drive units comprising: an actuator device undergoing magnetostrictive expansion; support means for guiding cyclic displacement of the actuator device during said expansion thereof, magnetic field control means for directional selection of unidirectional movement imparted to the driven load; and sprag locking means operatively mounted on the support means and enabled by the magnetic field control means for direct transfer to the driven load of driving force generated by said cyclic displacement of the actuator device to impart said unidirectional movement to the driven load.

* * * * *